United States Patent
Meyer et al.

(10) Patent No.: US 7,310,791 B2
(45) Date of Patent: Dec. 18, 2007

(54) METHOD FOR CORRECTING LAYOUT ERRORS

(75) Inventors: Dirk Meyer, Essex (GB); Uwe Mueller, Munich (DE)

(73) Assignee: Infineon Technologies AG, Munich (DE)

( * ) Notice: Subject to any disclaimer, the term of this patent is extended or adjusted under 35 U.S.C. 154(b) by 149 days.

(21) Appl. No.: 11/191,167

(22) Filed: Jul. 27, 2005

(65) Prior Publication Data
US 2006/0053400 A1    Mar. 9, 2006

(30) Foreign Application Priority Data
Jul. 27, 2004    (DE) .................... 10 2004 037 297

(51) Int. Cl.
*G06F 17/50*    (2006.01)
(52) U.S. Cl. ................................ 716/5; 716/4; 716/11
(58) Field of Classification Search .................... 716/5, 716/4, 11
See application file for complete search history.

(56) References Cited

U.S. PATENT DOCUMENTS

| 6,063,132 A * | 5/2000 | DeCamp et al. ................ 716/5 |
| 6,397,373 B1 | 5/2002 | Tseng et al. |
| 2004/0025098 A1 | 2/2004 | Meyer |

FOREIGN PATENT DOCUMENTS

DE    102 24 417 A1    12/2003

* cited by examiner

*Primary Examiner*—Sun James Lin
(74) *Attorney, Agent, or Firm*—Slater & Matsil, L.L.P.

(57) ABSTRACT

A method for correcting layout errors of a layout, for example layout errors of a layout of an electronic circuit, is disclosed. In order to be able to correct such layout errors with the least possible complexity, the layout is examined for the presence of layout errors with the aid of predetermined design rules, identical layout errors are combined in a respective error class, and all layout errors of an error class that are still present are automatically corrected without further checking in an identical manner as soon as the correction of a layout error of the respective error class that is used as an error representative has been performed.

23 Claims, 2 Drawing Sheets

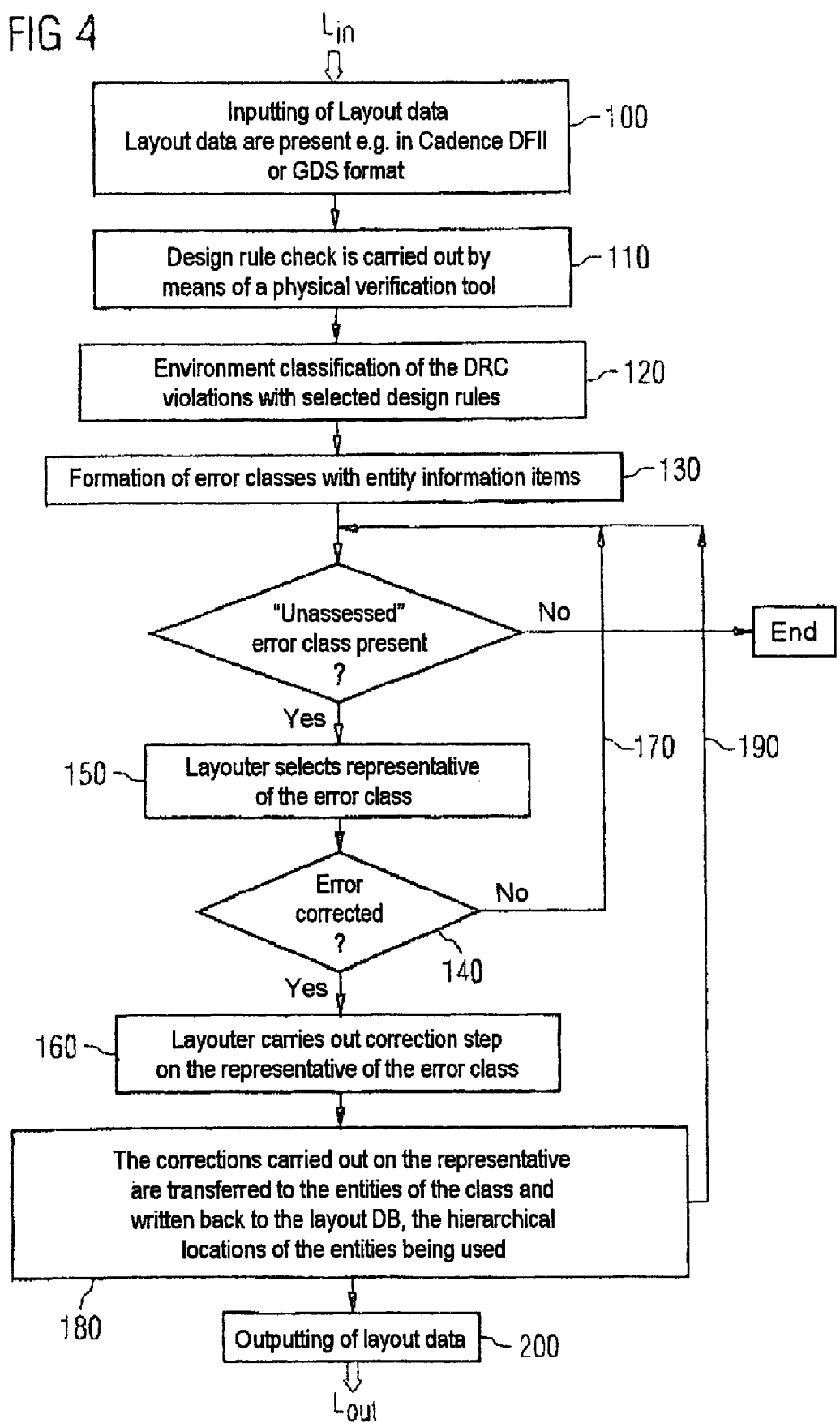

METHOD FOR CORRECTING LAYOUT ERRORS

This application claims priority to German Patent Application 10 2004 037 297.7, which was filed Jul. 27, 2004 and is incorporated herein by reference.

TECHNICAL FIELD

The invention relates to a method for correcting layout errors of a layout, for example, layout errors in a layout of an electronic component.

BACKGROUND

The published German patent application DE 102 24 417 A1, and corresponding U.S. Patent Publication No. 2004/0025098, which are both incorporated herein by reference, disclose a method for forming and classifying error markers. In addition to the actual error region, the spatial "environment" of the layout errors is taken into account in this method.

U.S. Pat. No. 6,397,373, which is incorporated herein by reference, is concerned with coping with problems in dealing with a high number of DR (Design Rule) violations within a complex layout. Like the published German patent application mentioned in the introduction, the method relates exclusively to the classification of errors, but not to the elimination of identified errors.

SUMMARY OF THE INVENTION

In one aspect, the invention specifies a method that makes it possible to correct layout errors in a layout—for example in the layout of an electronic circuit—with the least possible complexity.

Accordingly, it is provided according to a preferred embodiment of the invention that, in order to eliminate layout errors of a layout, firstly the layout is examined for the presence of layout errors with the aid of predetermined design rules. Afterward, identical layout errors are combined in, in each case, one and the same error class. Subsequently, all layout errors of an error class that have not yet been corrected are automatically corrected without further checking in an identical manner as soon as the correction of a layout error used as an error representative of the respective error class has been concluded.

One advantage of certain embodiments of the method according to the invention can be seen in the fact that repeated manual performance of identical correction steps for the correction of identical layout errors is superfluous. This is because, according to embodiments of the invention, all identical layout errors—that is to say, all errors of the same error class—are automatically eliminated as soon as one of the errors of the respective error class is eliminated, whether under the control of a data processing program or manually.

In other words, a correction of identical DR violations thus takes place through an automated transfer of the correction steps carried out on a single entity (or on a single erroneous layout element) to all entities (or all erroneous layout elements) of the relevant error class. In this case, it is unimportant for embodiments of the method according to the invention whether the triggering "start correction step" is carried out by means of an interactive method or fully automatic method. All that is crucial is that after a single error correction has been carried out, identical errors are corrected fully automatically in an identical manner. This fully automatic "post correction" leads to a productivity gain in the design process as a result of manual layout correction steps being saved.

The selection of the error representative is arbitrary. Moreover, the error representative may be selected by a layout engineer or be selected by machine—randomly or according to predetermined rules.

The automatic "post correction" of the remaining errors of an error class can be carried out particularly simply and thus advantageously by means of an electronic data processing system (DP system).

In order to identify the layout errors, the layout is tested for example with the aid of a physical verification program. Physical design errors can be identified by means of such a program.

Embodiments of the method according to the invention can be used for example in combination with all DRC-like (DRC: Design Rule Correction) programs as are used inter alia in the Mask Rule Check (MRC) step within the development flow of semiconductor components.

In order to enable a spatial assignment of the layout errors identified to the overall layout and thus to the layout hierarchy in a particularly simple manner, it is regarded as advantageous if for each layout error, the hierarchical error location thereof is, in each case, stored as entity information.

If a layout library is used for the layout design, it is regarded as advantageous if the layout library is corrected in a corresponding manner if layout errors can be attributed to layout errors of the layout library. Future identical errors can thus be avoided.

Preferably, items of information about the layout error and/or about the environment of the layout error are extracted in a targeted manner. Afterward, the identity of the layout errors can then be ascertained particularly simply exclusively on the basis of the extracted items of information. In this case, the items of information about the layout error may, for example, also comprise geometrical patterns or geometrical objects.

A pattern comparison is preferably carried out by means of each geometrical pattern or object being normalized prior to comparison according to predetermined rules. With regard to the normalization and comparison of patterns, reference should be made to the published German patent application DE 102 24 417 A1, and corresponding U.S. Patent Publication No. 2004/0025098, mentioned in the introduction, which thoroughly describes "normalization" for the purpose of pattern comparison.

Embodiments of the invention additionally relate to a data processing system for eliminating layout errors.

With regard to such a data processing system, embodiments specify a system that enables the correction of layout errors in a layout of, for example, an electronic circuit or an electronic component with the least possible complexity.

The data processing system is particularly preferably configured in such a way that it interrogates, for each error class, an input at the user end as to whether a correction of the respective error class is to be effected, in the case of a correction decision at the user end, logs the correction steps at the user end for the correction of the error representative with the formation of log data, and automatically corrects, on the basis of the log data, all layout errors of the respective error class that are still present in an identical manner, as was carried out at the user end on the basis of the error representative.

With regard to the advantages of the data processing system according to embodiments of the invention, reference should be made to the above explanations in connection with the method according to the invention, because the advantages of the method according to embodiments of the invention essentially correspond to the advantages of the data processing system according to the invention.

BRIEF DESCRIPTION OF THE DRAWINGS

For a more complete understanding of the present invention, and the advantages thereof, reference is now made to the following descriptions taken in conjunction with the accompanying drawing, in which:

FIG. 4 shows a flow diagram, which visualizes an exemplary embodiment of the method according to the invention by way of example.

DETAILED DESCRIPTION OF ILLUSTRATIVE EMBODIMENTS

During layout creation in a full-custom or semi-custom flow, computer programs are used for the physical verification of the layout in order to test the current state of the layout for compliance with physical design rules (Design Rule Check, abbreviated to "DRC"). In this case, modern physical verification programs (DRC programs) have recourse to the layout hierarchy and indicate DR violations as "deep" as possible in the layout hierarchy in order thus to simplify the subsequent error correction by a layout engineer, for example.

It is precisely in repetitive (repeating) DRAM designs that very many identical DR violations originating in recurring layout structures are often found. These identical DR violations are distinguished by the fact that the error marker itself and the layout relevant to the DR, in a defined environment of the error marker, are identical.

If identical DR violations originate in a subcell that is inserted repeatedly into the same layout context, the violation can be corrected very simply by eliminating the DR violation in the subcell once, all further DR violations thereby likewise being eliminated as well. However, the correction of identical DR violations is often substantially more complicated. Periodically occurring identical DR violations cannot always be assigned to a single cell since they occur in overlapped regions of two cells, for example, or since the input data required for the DRC are "scattered" widely over the hierarchy. In both cases, many identical DR violations are only reported in a supercell. Whereas, in DRAM designs the occurrence of identical DR violations is obvious as a result of the periodic construction of the layout, that is not always immediately the case for logic designs. However, in logic designs, too, identical DR violations may occur, e.g., as early as during the library (layout database) creation. Although identical DR violations may occur in mutually different cells of the chip, they nevertheless require identical correction steps.

An exemplary embodiment of the method according to the invention for eliminating errors is explained below in connection with FIGS. 1 to 4. This method involves carrying out an automated transfer of correction steps carried out on a single entity (or a single error element) to all entities (or error elements) of the same error class by means of an interactive method. This leads to a productivity gain in the design process as a result of manual layout correction steps being saved.

Figure 1:
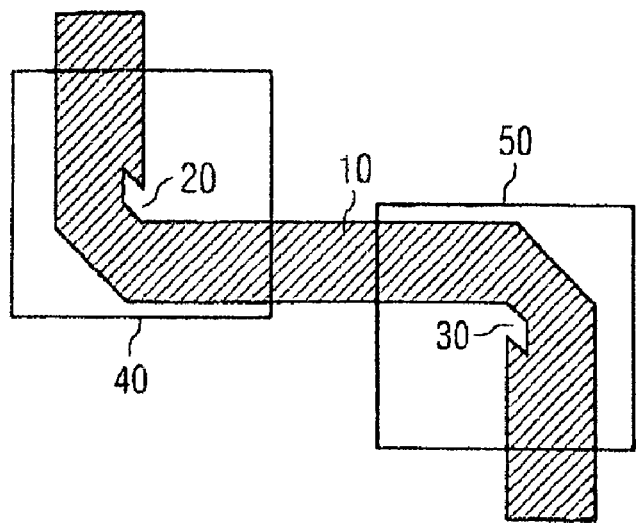
FIGS. 1-3 show a layout on the basis of which the elimination of so-called "notch" violations is elucidated by way of example.

FIG. 1 reveals a layout excerpt with an interconnect 10 with two identical "DR violations," which violate the design rule "minimum distance between structure edges" within the plane depicted. Both "DR violations" in each case comprise a layout error 20 and 30 in the form of a cutout (notch) extending into interconnect 10. Although the cutouts 20 and 30 are spatially rotated with respect to one another, they are nevertheless identical and can thus be classified in the same error class. Correspondingly, the two layout errors 20, 30 can also be eliminated in an identical manner.

An exemplary embodiment of a method for correcting the two layout errors 20, 30 is explained below in connection with FIG. 4.

In a first correction step 100 (see FIG. 4), layout data that define the layout to be corrected—formed by the interconnect 10 in FIG. 1—are fed into a data processing system in the Cadence DFII format, in the GDS format or in some other suitable format.

In a subsequent error detection step 110, the layout is examined for the presence of layout errors by means of a conventional physical verification program (e.g., the program "Dracula" from the company Cadence). In this case, by way of example, the layout errors 20, 30 in accordance with FIG. 1 are detected, inter alia.

Afterward, in accordance with program steps 120 and 130, the errors discovered are classified and subdivided into error classes. Only identical layout errors are, in each case, assigned to each error class. In this case, the error classification may involve taking account of items of information solely about the error and/or in addition, items of information about the environment of the errors. The environments 40 and 50, for example, may be taken into account with regard to the two errors 20 and 30.

In order to form the error classes, it is possible, for example, to carry out a pattern comparison taking account of geometrical patterns present in the error surroundings. The classification of the layout errors may be carried out, e.g., in the manner as described thoroughly in the incorporated published German patent application DE 102 24 417 A1.

In the formation of the error classes, each error class is allocated entity information items of the assigned layout errors. This means that, from each layout error (or "DRC error shape") of an error class, the "hierarchical location" is available for further evaluation. In this case, the "hierarchical location" designates, for example, that cell or those cells in which the layout error is reported and also the associated coordinates thereof.

Consequently, after the conclusion of step 130, a multiplicity of different error classes each having identical errors are present. Referring to FIG. 1, a single error class having the two layout errors 20 and 30 is thus formed since the two errors 20 and 30 are identical.

A subsequent program step 140 involves assessing each error class to establish whether or not a correction is to be carried out. This assessment may be made manually by a layout engineer or else by machine or by DP according to fixedly predetermined assessment rules. For this assessment, a representative error is, in each case, chosen beforehand for each error class, arbitrarily or according to a predetermined selection scheme (step 150). The decision as to whether a correction of the layout errors of the respective error class is to be effected is taken on the basis of the error representative.

In this way, all error classes or the error representatives thereof are assessed and either subjected to a correction (step 160) or left unchanged ("Branch" 170); what remain unchanged are, for example, those error classes that a layout engineer regards as irrelevant or unacceptable in terms of production engineering or are classified as "non critical" by a DP program according to predetermined rules.

The layout errors regarded as relevant or disturbing are subsequently corrected. For this purpose, firstly the error representative of the error class is processed automatically or manually (step 160). As soon as the error representative of the error class has been corrected, all layout errors of the respective error class are corrected automatically and without further inquiry—for example in computer-aided fashion—(step 180). In this case, the corrections carried out on the error representative of the error class are transferred to all layout errors (or entities) of the error class, and the layout data are altered correspondingly. The "layout database" used for creating the "layout data" may also be modified in this case if the layout errors relate to the database elements of the "layout database." The hierarchical location indications of the layout errors (or entities) are used for the correction of the "layout database."

As a result, corrected layout data $L_{out}$ are thus obtained from the layout data $L_{in}$ fed in on the input side as soon as the assessment and correction loop 190 formed by program steps 140 to 180 has been run through completely (output step 200).

The correction steps carried out are preferably recorded or concomitantly logged in a suitable form, e.g., in the form of additive and subtractive "correction shapes".

Figure 2:
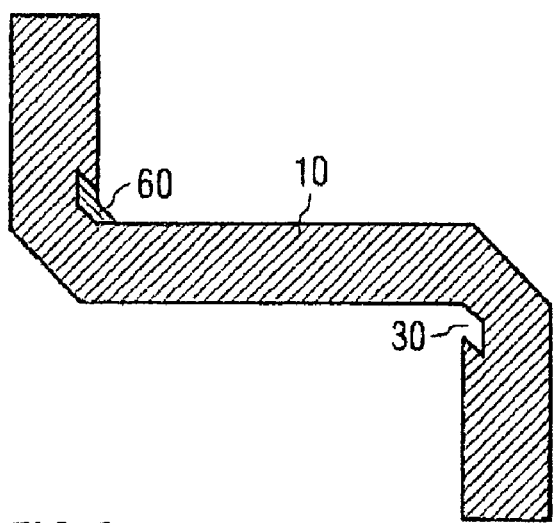
Figure 3:
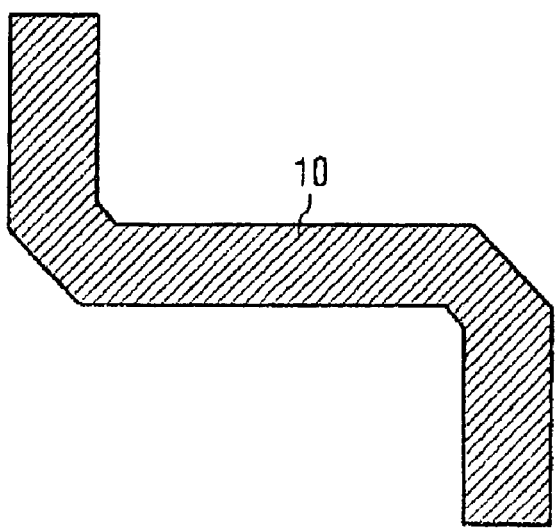

The performance of the correction steps 160 and 180 in accordance with FIG. 4 is illustrated in detail again in FIGS. 2 and 3 using the example of the layout errors 20, 30 in accordance with FIG. 1.

FIG. 2 reveals a correction element 60, which is inserted into the cutout 20 in the interconnect 10 in such a way that the cutout 20 disappears. The other cutout 30 remains uncorrected as yet at this point in time. The insertion of the correction element 60 into the cutout 20 corresponds to correction step 160 in accordance with FIG. 4; the cutout 20 as a layout error thus corresponds to the error representative, which is first corrected.

After, for example, the manually effected correction of the layout error 20, the layout error 30 is eliminated by DP fully automatically or without further inquiry and without further intervention at the user end (FIG. 3). This step corresponds to step 180 in accordance with FIG. 4. In the case of this automatic correction step 180, all correction measures that were performed in connection with the error representative 20 are repeated in an identical manner.

What is claimed is:

1. A method for eliminating layout errors of a layout, the method comprising:
    examining the layout for the presence of layout errors, the examining performed with the aid of predetermined design rules;
    combining identical layout errors in a respective error class; and
    automatically correcting all the layout errors of an error class that are still present without further checking in an identical manner as soon as a correction step of a layout error of the respective error class that is used as an error representative has been performed.

2. The method according to claim 1, further comprising logging correction steps performed on the basis of the error representative by means of an electronic data processing system, wherein the layout errors of the respective error class that are still present are corrected by means of the electronic data processing system on the basis of log data on the correction steps.

3. The method according to claim 1, wherein, for each layout error, a hierarchical error location is stored as entity information.

4. The method according to claim 1, further comprising correcting a layout library that was used to generate the layout in a corresponding manner if layout errors can be attributed to layout errors of the layout library.

5. The method according to claim 1, further comprising extracting items of information about the layout error and/or about an environment of the layout error and ascertaining an identity of layout errors on the basis of the extracted items of information.

6. The method according to claim 5, wherein the extracted items of information about the layout errors have geometrical patterns or objects.

7. The method according to claim 6, further comprising normalizing each geometrical pattern or object prior to the comparison according to predetermined rules.

8. The method according to claim 1, further comprising testing the layout with the aid of a commercially available DRC program.

9. The method according to claim 1, wherein physical design errors are processed as the layout errors.

10. The method according to claim 1, further comprising testing the layout with the aid of a physical verification program.

11. The method according to claim 1, wherein the layout comprises a layout of a semiconductor device.

12. The method according to claim 11, wherein the layout includes a plurality of recurring layout structures.

13. The method according to claim 12, wherein the semiconductor device comprises a dynamic random access memory device.

14. A data processing system for eliminating layout errors of a layout, the data processing system comprising a microprocessor device, which is embodied in such a way that it examines the layout for the presence of the layout errors with the aid of predetermined design rules; combines identical layout errors in a respective error class; and automatically corrects all the layout errors of an error class that are still present without further checking in an identical manner as soon as a correction of a layout error of the respective error class that is used as an error representative has been concluded.

15. The data processing system according to claim 14, further comprising an input device coupled to the microprocessor device, the input device configured such that correction steps for the correction of the respective error representative can be input at a user end, wherein the microprocessor device is embodied in such a way that it automatically corrects all the layout errors of the respective error class without further checking in an identical manner as soon as the correction of the error representative of the respective error class has been concluded at the user end.

16. The data processing system according to claim 15, wherein the system is configured in such a way that it:
    interrogates, for each error class, an input at the user end as to whether a correction of the respective error class is to be effected;
    in the case of a correction decision at the user end, logs the correction steps at the user end for the correction of the error representative with a formation of log data; and
    automatically corrects, on the basis of the log data, all the layout errors of the respective error class that are still present in an identical manner, as was carried out at the user end on the basis of the error representative.

17. The data processing system according to claim 14, further comprising an electronic data processing system coupled to the microprocessor and configured to log correction steps carried out on the basis of the error representative.

18. The data processing system according to claim 17, wherein the layout errors of the respective error class that are still present are corrected by means of the electronic data processing system on the basis of log data on the correction steps.

19. The data processing system according to claim 14, wherein the data processing system is configured to correct a layout library that was used to generate the layout in a corresponding manner if layout errors can be attributed to layout errors of the layout library.

20. The data processing system according to claim 14, wherein the data processing system is configured to extract items of information about the layout error and/or about an environment of the layout error and ascertain an identity of layout errors on the basis of the extracted items of information.

21. The data processing system according to claim 20, wherein the items of information about the layout errors have geometrical patterns or objects.

22. The data processing system according to claim 21, wherein the data processing system is further configured to normalize each geometrical pattern or object prior to a comparison according to predetermined rules.

23. The data processing system according to claim 14, wherein the microprocessor runs a physical verification program to test the layout.

* * * * *